United States Patent
Tanaka

(10) Patent No.: US 8,652,859 B2
(45) Date of Patent: Feb. 18, 2014

(54) METHOD FOR MANUFACTURING LIGHT-EMITTING DEVICE AND MANUFACTURING APPARATUS OF LIGHT-EMITTING DEVICE

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/357,900

(22) Filed: Jan. 25, 2012

(65) Prior Publication Data

US 2012/0196388 A1 Aug. 2, 2012

(30) Foreign Application Priority Data

Jan. 31, 2011 (JP) ................................. 2011-017966

(51) Int. Cl.
*H01L 21/66* (2006.01)
*G01R 31/26* (2006.01)

(52) U.S. Cl.
USPC ............................................. 438/16; 438/14

(58) Field of Classification Search
USPC ........................................................ 438/16
See application file for complete search history.

(56) References Cited

U.S. PATENT DOCUMENTS

| | | | |
|---|---|---|---|
| 5,359,684 A * | 10/1994 | Hosokawa et al. | 385/33 |
| 6,512,385 B1 | 1/2003 | Pfaff et al. | |
| 6,590,335 B1 | 7/2003 | Nagayama | |
| 6,605,372 B1 | 8/2003 | Kubota | |
| 6,909,111 B2 | 6/2005 | Yamagata et al. | |
| 2002/0142697 A1* | 10/2002 | Yamagata et al. | 445/24 |
| 2007/0141719 A1* | 6/2007 | Bui | 436/173 |
| 2008/0026543 A1* | 1/2008 | Miyairi et al. | 438/455 |
| 2011/0121272 A1* | 5/2011 | Lee et al. | 257/40 |
| 2011/0278603 A1* | 11/2011 | Miyazawa et al. | 257/88 |

FOREIGN PATENT DOCUMENTS

| | | | | |
|---|---|---|---|---|
| EP | 1 021 070 A | | 7/2000 | |
| JP | 2002-260857 A | | 9/2002 | |
| JP | WO2010092749 | * | 8/2010 | H05B 33/10 |
| JP | 2011-071032 A | | 4/2011 | |

* cited by examiner

*Primary Examiner* — Charles Garber
*Assistant Examiner* — Brigitte Paterson
(74) *Attorney, Agent, or Firm* — Eric J. Robinson; Robinson Intellectual Property Law Office, P.C.

(57) ABSTRACT

An object is to provide a method for manufacturing a light-emitting device in which a defective portion is insulated. In addition, another object is to provide a manufacturing apparatus of a light-emitting device in which a defective portion is insulated. After a hemispherical lens is formed to overlap with a light-emitting element, the defective portion is detected. Then, the hemispherical lens overlapping with the light-emitting element including the detected defective portion may be irradiated with a laser beam having a low energy density, and the defective portion may be insulated by light condensed through the hemispherical lens.

8 Claims, 11 Drawing Sheets

METHOD FOR MANUFACTURING LIGHT-EMITTING DEVICE AND MANUFACTURING APPARATUS OF LIGHT-EMITTING DEVICE

BACKGROUND OF THE INVENTION

1. Field of the Invention

The present invention relates to a method for manufacturing a light-emitting device and a manufacturing apparatus of a light-emitting device.

2. Description of the Related Art

A light-emitting element in which a layer containing a light-emitting organic compound (also referred to as an EL layer) that spreads as a film is provided between a pair of electrodes has been known. Such a light-emitting element is called, for example, an organic EL element, and light emission can be obtained from a light-emitting organic compound when voltage is applied between a pair of electrodes. As examples of a light-emitting device including an organic EL element, a display device and a planar lighting device can be given. Note that in the display device, the organic EL element is formed over an active matrix substrate.

However, the EL layer is extremely thin. Therefore, a pair of electrodes of an organic EL element is easily short-circuited in the case where a conductive foreign substance enters between the pair of electrodes. The short circuit results in failures such as breakages of the organic EL element, deterioration of the organic EL element due to heat generation, and an increase of power consumption due to leakage current.

Therefore, a method and an apparatus for detecting defects caused by a short circuit of the pair of electrodes in the organic EL element or potential defects prior to the short circuit and irradiating the defects with a laser beam so that the defects are insulated have been proposed (e.g., Patent Document 1).

REFERENCE

Patent Document 1

[Patent Document 1] Japanese Published Patent Application No. 2002-260857

SUMMARY OF THE INVENTION

In order to insulate a light-emitting element including defects caused by a short circuit of a pair of electrodes or potential defects prior to the short circuit (hereinafter both the defects are referred to as a defective portion), a laser beam spot having high energy density is necessary. However, in order to obtain a laser beam spot having energy density which is high enough so that a defective portion of a light-emitting element can be insulated, it is necessary to use a laser having a high output or to condense a laser beam having low energy density with an optical system (hereinafter refer to as an objective lens) which is disposed close to a surface to be irradiated. However, there are the following problems even with any method.

In a method using a laser having a high output, there is a problem in that the price of an apparatus rises. In a method for using a laser having a low output, an objective lens having a high magnification is needed, which tends to complicate the structure of an apparatus. Moreover, the objective lens has a narrow depth of focus; therefore, it is necessary to precisely control the position of an optical system with respect to a surface to be irradiated. Further, an objective lens for condensing a laser beam needs to be provided close to the surface to be irradiated, and it is difficult to prevent a phenomenon in which an objective lens is contaminated by an evaporated material from the surface to be irradiated by providing a shield between the objective lens and the surface to be irradiated.

It is difficult to insulate a defective portion of a light-emitting element which is found during a manufacturing process of a light-emitting device in a treatment chamber (e.g., a vacuum chamber) which is isolated from the air. This is because, when a laser having a high output is disposed outside of the treatment chamber with a structure in which a window material that transmits a laser beam is provided on a wall surface of the treatment chamber and a defective portion of a light-emitting element is irradiated with a laser beam from the laser through the window material, a problem arises in that the window material is damaged by the laser beam having a high output. In addition, when a laser having a low output is used with a structure in which an objective lens is disposed in a treatment chamber, a problem arises in that an organic substance or the like evaporated from a defective portion is attached to an objective lens every time insulating treatment is performed and therefore the objective lens is misted. In either case, there has been a problem in that such apparatuses cannot withstand the use for a long time.

The present invention is made in view of the foregoing technical background. Thus, one object of one embodiment of the present invention is to provide a method for manufacturing a light-emitting device by insulation of a defective portion of a light-emitting element included in the light-emitting device. In addition, another object of one embodiment of the present invention is to provide a manufacturing apparatus of a light-emitting device.

In order to achieve the above objects, the present invention focuses on a hemispherical lens which is provided to overlap with a light-emitting region of a light-emitting element to increase extraction efficiency of light.

After the hemispherical lens is formed to overlap with the light-emitting element, a defective portion is detected. Then, the present inventor has arrived at a method in which the hemispherical lens overlapping with the light-emitting element including the detected defective portion is irradiated with a laser beam having a low energy density, and the defective portion is insulated with light condensed through the hemispherical lens. Accordingly, the above objects are achieved.

That is, one embodiment of the present invention is a method for manufacturing a light-emitting device, including a first step of forming a light-emitting element, which includes a layer containing a light-emitting organic compound between a pair of electrodes of which at least one is a light-transmitting electrode, on the other surface of a substrate whose one surface is provided with a hemispherical lens, so that the light-transmitting electrode is aligned with the hemispherical lens; a second step of forming a sealing member covering the light-emitting element; a third step of detecting a defective portion of the light-emitting element while inspection power is supplied to the light-emitting element; and a fourth step of insulating the defective portion by irradiation with a laser beam through the hemispherical lens when the defective portion is detected.

In addition, another embodiment of the present invention is a method for manufacturing a light-emitting device, including a first step of forming a light-emitting element which includes a layer containing a light-emitting organic compound between a pair of electrodes of which at least one is a light-transmitting electrode; a second step of forming a sealing member covering the light-emitting element; a third step of forming a hemispherical lens on the side of the light-emitting element, where the light-transmitting electrode is provided, in accordance with a region where the light-emitting organic compound is provided; a fourth step of detecting a defective portion of the light-emitting element while inspection power is supplied to the light-emitting element; and a fifth step of insulating the defective portion by irradiation with a laser beam through the hemispherical lens when the defective portion is detected.

The above embodiments of the present invention are a method in which a defective portion of a light-emitting device including a light-emitting element and a hemispherical lens overlapping with a light extraction region of the light-emitting element is insulated by irradiation with a laser beam through the hemispherical lens. According to this method, a light-emitting device can be manufactured by insulation of a defective portion of a light-emitting element included in the light-emitting device. In addition, the above embodiments of the present invention are a method in which the hemispherical lens disposed close to the defective portion is used to condense laser beams. According to this method, an optical system having a high magnification and a narrow depth of focus are not needed to be disposed close to a surface to be irradiated, whereby the structure of a manufacturing apparatus can be simplified. Moreover, the above embodiments of the present invention are a method in which the hemispherical lens is disposed between the defective portion and a laser irradiation unit so that the defective portion is irradiated with a laser beam. According to this method, an evaporated material from the surface to be irradiated does not contaminate the laser irradiation unit and thus the frequency of maintenance can be reduced.

In addition, another embodiment of the present invention is a method for manufacturing a light-emitting device, including a first step of forming a light-emitting element, which includes a layer containing a light-emitting organic compound between a pair of electrodes of which at least one is a light-transmitting electrode, on the other surface of a substrate whose one surface is provided with a hemispherical lens, so that the light-transmitting electrode is aligned with the hemispherical lens; a second step of detecting a defective portion of the light-emitting element while inspection power is supplied to the light-emitting element; a third step of insulating the defective portion by irradiation with a laser beam through the hemispherical lens in a treatment chamber where pressure is reduced when the defective portion is detected; and a fourth step of forming a sealing member covering the light-emitting element in which the defective portion is insulated.

The above embodiment of the present invention is a method in which a substrate with a light-emitting element is disposed in a treatment chamber where the pressure is reduced; a defective portion of the light-emitting element, which overlaps with a light extraction region of the light-emitting element, is detected; and the defective portion is insulated by irradiation with a laser beam through a hemispherical lens and a window material provided on a wall surface of the treatment chamber, which transmits the laser beam. According to this method, a light-emitting device can be manufactured by insulation of a defective portion of a light-emitting element provided in a substrate with a light-emitting element before a sealing member is provided. In addition, the above embodiment of the present invention is a method in which the hemispherical lens disposed close to the defective portion is used to perform insulation by condensed laser beams. According to this method, an optical system having a high magnification and a narrow depth of focus are not needed to be disposed, whereby the structure of a manufacturing apparatus can be simplified. Moreover, the above embodiment of the present invention is a method in which the hemispherical lens is disposed between the defective portion and a laser irradiation unit so that the defective portion is irradiated with a laser beam. According to this method, an evaporated material from the surface to be irradiated does not contaminate the laser irradiation unit and thus the frequency of maintenance can be reduced.

In addition, another embodiment of the present invention is the method for manufacturing a light-emitting device, including a step of irradiating the hemispherical lens with a laser beam whose energy density is greater than or equal to 1 $kW/cm^2$ and less than or equal to 10 $MW/cm^2$ or greater than or equal to 1 $\mu J/cm^2$ and less than or equal to 10 $mJ/cm^2$. In the above step, a diameter of the hemispherical lens is greater than or equal to 0.2 mm and less than or equal to 20 mm, and a beam diameter which is defined in a half width is greater than or equal to 0.1 mm and less than or equal to the diameter of the hemispherical lens.

The above embodiment of the present invention is a method for manufacturing a light-emitting device, in which a laser beam whose energy density is relatively low is condensed to a defective portion of a light-emitting element with a hemispherical lens and the defective portion is insulated. According to this method, a laser whose output is relatively small can be used, whereby the cost of an apparatus can be reduced. Moreover, with the use of a laser irradiation unit in which a plurality of lasers whose output is relatively small and which is inexpensive is arranged, processing can be performed in parallel. Further, with the use of a plurality of generated laser beams whose energy density is low by divergence from a laser beam whose energy density is high, processing can be performed in parallel. When the processing can be performed in parallel, the processing time can be shortened as an advantageous effect.

Further, another embodiment of the present invention is the method for manufacturing a light-emitting device, including a step of detecting the defective portion through the hemispherical lens while a reverse bias voltage is supplied from a power supply to a first electrode and a second electrode of the light-emitting element provided in the light-emitting device.

The above embodiment of the present invention is a method for manufacturing a light-emitting device, in which a reverse bias voltage is applied to a light-emitting element, current is made to flow through a defective portion which is a defect of a short circuit between a pair of electrodes or a potential defect, and the defective portion is detected. According to this method, current unlikely flows through a normal portion of the light-emitting element but flows through the defective portion; therefore, the defective portion can be detected easily. Further, light emitted from the defective portion can be extracted at high efficiency from the unit for detecting a defective portion side by the hemispherical lens; therefore, the defective portion can be detected easily. Specifically, near-infrared light emitted from the defective portion can be extracted at high efficiency. Furthermore, the following failures can be prevented: a failure in which high current is made to flow without intention through a defective portion by application of a forward bias voltage to a light-emitting device including the defective portion, which results in destroy of the light-emitting element including the defective portion; and a failure in which a normal light-emitting element adjacent to the light-emitting element including the defective portion or even the entire light-emitting device is destroyed.

Furthermore, another embodiment of the present invention is a manufacturing apparatus of a light-emitting device, including a treatment chamber provided inside with a support unit which is separated from air by a wall surface having a window material which transmits a laser beam emitted from a laser irradiation unit; and an evacuation unit of the treatment chamber, a unit for detecting a defective portion, the laser irradiation unit, a power supply, a control unit, and a unit for forming a sealing member, which are provided outside of the treatment chamber. In the manufacturing apparatus, the support unit can support a substrate with a light-emitting element, in which a hemispherical lens overlapping with a light extraction region of the light-emitting element provided in the substrate with the light-emitting element is provided to face the window material; the unit for detecting a defective portion includes a near-infrared sensor; the laser irradiation unit emits a laser beam whose energy density is greater than or equal to 1 $kW/cm^2$ and less than or equal to 10 $MW/cm^2$ or greater than or equal to 1 $\mu J/cm^2$ and less than or equal to 10 $mJ/cm^2$; the control unit outputs a first control signal to the power supply and then a second control signal to the unit for detecting a defective portion; the power supply outputs a potential for detecting a defective portion in accordance with the first control signal; the unit for detecting a defective portion detects, in accordance with the second control signal, near-infrared light emitted from the substrate with the light-emitting element, which is supported by the support unit, using the near-infrared sensor, and generates an image signal as well as positional information of the near-infrared light; the control unit outputs a third control signal including positional information of the defective portion which is extracted from the image signal to the laser irradiation unit; the laser irradiation unit emits a laser beam to the defective portion in accordance with the third control signal; and the unit for forming a sealing member forms a sealing member on a side of the substrate with the light-emitting element supported by the support unit, which is opposite to a side from which the laser beam enters.

The above embodiment of the present invention includes an evacuation unit, and, inside a treatment chamber separated from the air, a unit for supporting a substrate with a light-emitting element, in which a hemispherical lens overlapping with a light extraction region of the light-emitting element is provided, to face a window material provided on a wall surface of the treatment chamber. In addition, outside the treatment chamber, the following are included: a power supply which outputs a potential for detecting a defective portion (e.g., a reverse bias potential) to the light-emitting element; a unit for detecting a defective portion which can detect near-infrared light caused by current flowing through the defective portion and which includes a near-infrared sensor capable of generating an image including positional information of the defective portion; a laser irradiation unit which emits a laser beam with which the defective portion can be irradiated; and a control unit. According to this structure, a light-emitting device can be manufactured by insulation of the defective portion of the light-emitting element provided in the substrate with the light-emitting element before a sealing member is provided. Moreover, an evaporated material from a surface to be irradiated does not contaminate the laser irradiation unit and thus the frequency of maintenance can be reduced. Further, a unit for forming a sealing member is included in addition to the above structure. According to this structure, after the defective portion is insulated, a sealing member covering the insulated portion can be formed. Since the sealing member can be formed directly on the insulated portion, a phenomenon in which an impurity is diffused into the light-emitting element from the insulated portion can be prevented.

Note that in this specification, an "EL layer" refers to a layer provided between a pair of electrodes in a light-emitting element. Thus, a light-emitting layer containing an organic compound that is a light-emitting substance which is interposed between electrodes is one mode of the EL layer.

According to the present invention, a method for manufacturing a light-emitting device by insulation of a defective portion of a light-emitting element included in the light-emitting device can be provided. In addition, a manufacturing apparatus of a light-emitting device can be provided.

DETAILED DESCRIPTION OF THE INVENTION

Figure 1A:
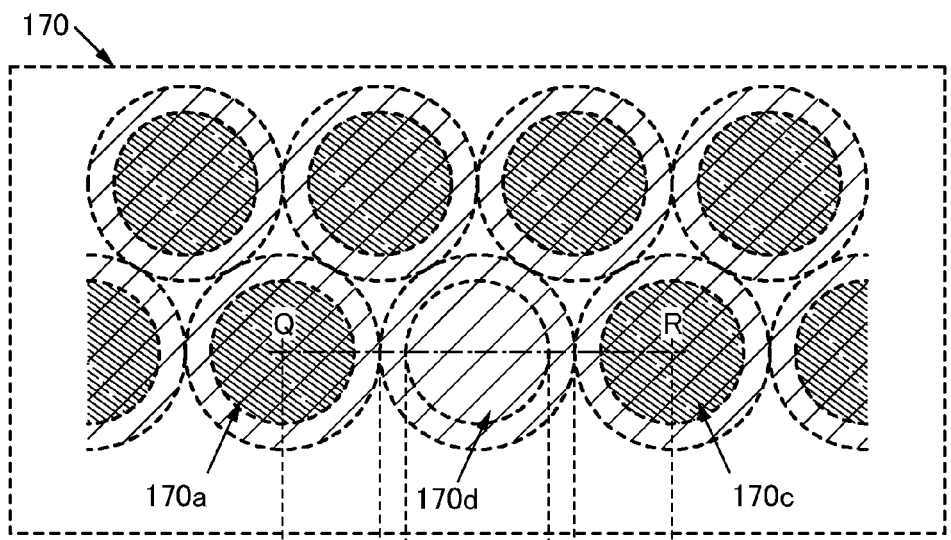
FIGS. 1A and 1B illustrating a structure of a light-emitting device according to an embodiment.

Embodiments are described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that, in the structures of the invention described below, the same portions or portions having similar functions are denoted by the same reference numerals in different drawings, and the descriptions of such portions are not repeated.

[Embodiment 1]

In this embodiment, with reference to FIGS. 1A and 1B, FIGS. 2A to 2C, and FIGS. 3A and 3B, a method for manufacturing a light-emitting device will be described in which a substrate with a light-emitting element, including a light-emitting element and a hemispherical lens overlapping with a light extraction region of the light-emitting element, is disposed in a treatment chamber where the pressure is reduced; a defective portion of the light-emitting element is detected; the defective portion is insulated by irradiation with a laser beam through the hemispherical lens and a window material provided on a wall surface of the treatment chamber; and then a sealing member is provided.

Figure 1B:
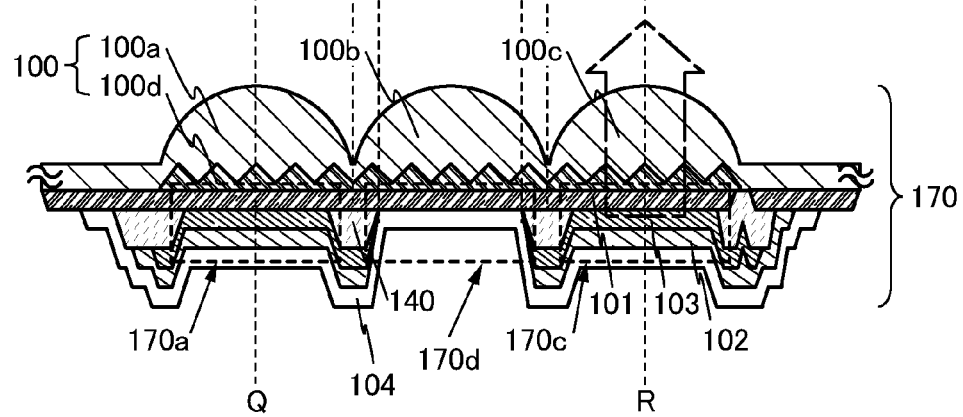

FIGS. 1A and 1B illustrate an example of a structure of a light-emitting device manufactured with a method described as an example in this embodiment. FIG. 1A is a top view of a light-emitting device 170, and FIG. 1B is a cross-sectional view taken along the line Q-R of FIG. 1A. The light-emitting device 170 includes a light-emitting element 170a, a light-emitting element 170c, and an insulated element 170d which are in contact with a substrate 100.

The substrate 100 includes a hemispherical lens (e.g., a hemispherical lens 100a, a hemispherical lens 100b, and a hemispherical lens 100c) and an uneven structure 100d. A first electrode 101 is formed in contact with a flat surface of the uneven structure 100d of the substrate 100.

A structure body including the hemispherical lens 100a, the uneven structure 100d, and the first electrode 101 transmit light emitted from the light-emitting element 170a. The refractive index of the structure body including the hemispherical lens 100a is larger than that of the air, and the refractive index of the uneven structure 100d is larger than that of the structure body including the hemispherical lens 100a and is almost equivalent to that of the first electrode 101. With such a structure, light emitted from the light-emitting elements 170a and 170c can be efficiently extracted to the air. This is because the uneven structure and the hemispherical lenses are provided on the interface on which light travels from a medium having a high refractive index to a medium having a low refractive index and thus it is difficult to satisfy the conditions for repeating total reflection.

A partition wall 140 has an opening and provided in contact with the first electrode 101. The light-emitting device 170 described as an example in this embodiment includes light-emitting elements (e.g., the light-emitting elements 170a and 170c) including the first electrode 101 overlapping with a plurality of openings provided in the partition wall 140, second electrodes 102 overlapping with the first electrode 101, and layers 103 containing a light-emitting organic compound provided between the first electrode 101 and the second electrodes 102.

In addition, the insulated element 170d is a light-emitting element irradiated with a laser beam as will be described later, and the first electrode 101 and the second electrode 102 are insulated from each other.

The light-emitting elements 170a and 170c and the insulated element 170d are provided with a sealing member 104.

Next, a method for manufacturing a light-emitting device will be described with reference to FIGS. 2A to 2C and FIGS. 3A and 3B.

<First Step of Forming Substrate with Light-Emitting Element>

The structure body including the hemispherical lens 100a, where unevenness is formed at a bottom surface, is shaped by an injection molding method or the like. A material that can be used for the structure body including the hemispherical lens 100a needs to transmit at least light emitted from a light-emitting element formed later at a transmittance higher than or equal to 70% and lower than 100%. For example, an acrylic resin and polycarbonate can be given. Note that when a material whose refractive index is higher than or equal to 1.4 and lower than or equal to 1.7 is used, the cost of a hemispherical lens can be reduced, which is preferable.

Next, the uneven structure 100d is formed in contact with the uneven structure formed at the bottom surface of the hemispherical lens 100a. It is preferable that a material that can be used for the uneven structure 100d transmit light emitted from a light-emitting element formed later at a transmittance higher than or equal to 70% and lower than 100% and have a refractive index higher than that of the hemispherical lens 100a, specifically higher than or equal to 1.6 and lower than or equal to 2.3. As examples of the material, a resin containing bromine and a resin containing sulfur can be given. For example, a sulfur-containing polyimide resin, an episulfide resin, a thiourethane resin, or a brominated aromatic resin can be used. In addition, polyethylene terephthalate (PET), triacetyl cellulose (TAC), or the like can be used.

In the case where the uneven structure is formed using an organic resin, a glass layer with a thickness greater than or equal to 25 μm and less than or equal to 100 μm may be used between the uneven structure 100d and the first electrode 101. The thickness of the glass layer is typically greater than or equal to 45 μm and less than or equal to 80 μm. By combining an organic resin substrate and the glass layer, moisture, an impurity, or the like can be prevented from entering an organic compound or a metal material included in the light-emitting element from the outside of the light-emitting device, and the weight of the light-emitting device can be reduced. A material whose refractive index is higher than or equal to 1.6 and lower than or equal to 2.3 is particularly preferable because the extraction efficiency of light is not reduced.

Next, a conductive film for forming the first electrode 101 is formed on a flat surface of the uneven structure 100d. The conductive film needs to transmit at least light emitted from a light-emitting element formed later at a transmittance higher than or equal to 70% and lower than 100%, and can be formed using indium oxide, composite oxide of indium and tin (ITO), composite oxide of indium and zinc, zinc oxide, zinc oxide to which gallium is added, or graphene, for example. In addition, a metal material such as gold, platinum, nickel, tungsten, chromium, molybdenum, iron, cobalt, copper, palladium, or titanium can be used. Further, a nitride of the metal material (e.g., titanium nitride) or the like which is thinned to have a light-transmitting property may be used. Then, the first electrode 101 is formed from the conductive film with a resist mask. In addition, with the conductive film, a first terminal 171 connected to the first electrode and a second terminal 172 connected to the second electrode in the light-emitting element are formed.

Next, the partition wall 140 having openings is formed on the first electrode so as to overlap with the hemispherical lens. The partition wall 140 needs to have at least an insulating property, and an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular compound such as polyimide, aromatic polyamide, or polybenzimidazole; or a siloxane material can be used, for example. Alternatively, a vinyl resin such as polyvinyl alcohol or polyvinyl butyral; or a resin material such as an epoxy resin, a phenol resin, a novolac resin, an acrylic resin, a melamine resin, or a urethane resin can be used. Further alternatively, an organic material such as benzocyclobutene, parylene, or polyimide; a compound material made by polymerization; a composition material containing a water-soluble homopolymer and a water-soluble copolymer; or the like may be used. As a manufacturing method, a CVD method, a sputtering method, a droplet discharge method, a dispenser method, a printing method, or the like can be used. Alternatively, a thin film or the like obtained by a spin-coating method can be used. Note that at an edge of the opening, it is preferable that a side surface of the partition wall 140 have an angle of gradient that is greater than or equal to 10 degrees and less than 60 degrees, and preferably greater than or equal to 25 degrees and less than or equal to 45 degrees, with respect to a surface of the first electrode 101. Further, it is preferable that the partition wall 140 be curved. When the partition wall is in contact with such an angle, a failure such as a short circuit between the first electrode and the second electrode can be prevented. Note that the opening of the partition wall overlaps with a light extraction region of a light-emitting element formed later, which transmits light emitted from an organic compound (see FIG. 2A).

As a modification example of the partition wall, a structure in which a first partition wall is formed on the first electrode and an inverted tapered second partition wall whose width is narrower than that of the first partition wall is formed on the first partition wall may be employed. With the inverted tapered second partition wall, the second electrode can be separated between adjacent light-emitting elements. In addition, a failure of a short circuit between an end portion of the separated second electrode and the first electrode can be prevented by narrowing the width of the second partition wall than the width of the first partition wall.

Figure 2A:
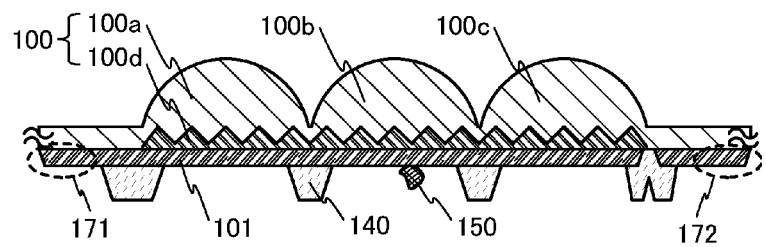
FIGS. 2A to 2C illustrating a method for manufacturing a light-emitting device according to an embodiment.
Figure 2B:
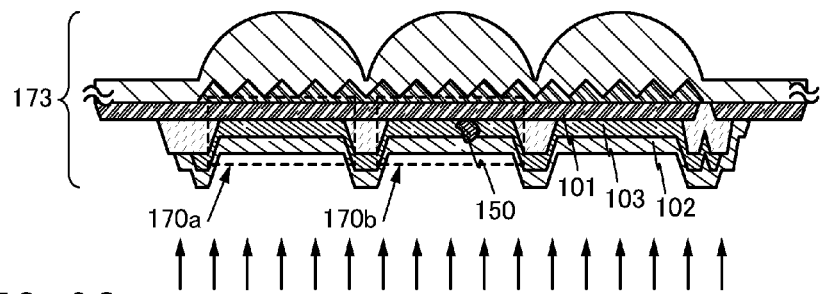
Figure 2C:
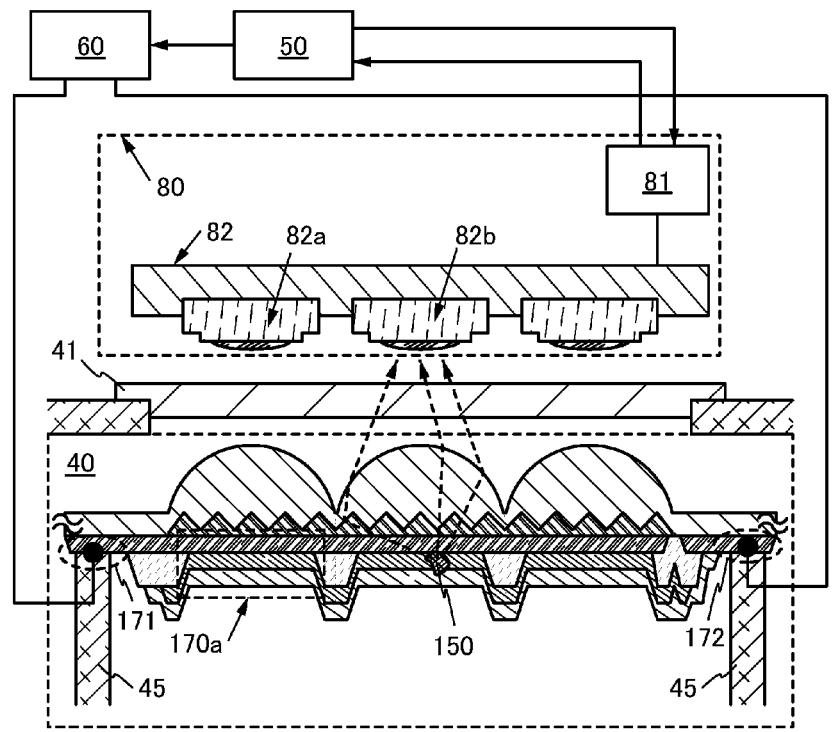

Note that in FIGS. 2A to 2C, a state in which a conductive particle 150 which is a foreign substance is in contact with the first electrode 101 is schematically illustrated.

Next, the light-emitting element is formed. The layer 103 containing a light-emitting organic compound is formed on the first electrode 101, and then the second electrode 102 is formed thereon. The layer 103 containing a light-emitting organic compound can be formed by a vacuum evaporation method, a spin-coating method, or the like as appropriate. In addition, the second electrode 102 can be formed by a vacuum evaporation method, a sputtering method, or the like as appropriate.

Through the above steps, a substrate 173 with a light-emitting element provided with the light-emitting element 170a can be formed. Note that since there is the conductive particle 150 between the first electrode 101 and the second electrode 102, the substrate 173 with the light-emitting element includes an element 170b including a defective portion (see FIG. 2B).

<Second Step of Detecting Defective Portion>

A method for detecting the defective portion of the substrate with the light-emitting element with the use of a unit for detecting a defective portion is described with reference to FIG. 2C.

The manufactured substrate 173 with the light-emitting element is transferred to a treatment chamber 40 by a transfer robot or the like, and the substrate 173 with the light-emitting element is fixed to a support unit 45. Note that the support unit 45 supports the substrate 173 with the light-emitting element, so that the hemispherical lens of the substrate 173 with the light-emitting element faces a window material 41 provided on a wall surface of the treatment chamber 40.

Note that the treatment chamber 40 is preferably evacuated. As a method for evacuating the treatment chamber 40, a pressure reducing unit which is not illustrated in FIG. 2C is preferably used, and a turbo pump, a cryopump, or the like can be used as an evacuation unit. In particular, a method for performing irradiation with a laser beam in an environment where the pressure is reduced less than the atmospheric pressure is preferable. This is because a material included in a light-emitting element easily vaporizes in the environment where the pressure is reduced and thus the defective portion can be easily removed from the substrate with the light-emitting element.

Alternatively, the treatment chamber 40 may be filled with a dry inert gas. Since the substrate 173 with the light-emitting element is not provided with a sealing member, it is necessary to be treated in a dry environment so that the reliability of the light-emitting element is not degraded. As the dry inert gas, a nitrogen gas, a rare gas (typically, an argon gas), or the like, whose dew point is lower than or equal to −70° C., can be used.

In addition, the substrate 173 with the light-emitting element and a power supply 60 are electrically connected to each other. For example, a contact electrically connected to the first terminal 171 and a contact electrically connected to the second terminal 172 of the substrate 173 with the light-emitting element are provided in the support unit 45, and the substrate 173 with the light-emitting element and the power supply 60 are connected to each other through the contacts.

Next, a control unit 50 outputs a first control signal to the power supply 60, and the power supply 60 outputs a potential for detecting a defective portion to the first terminal 171 and the second terminal 172 of the substrate 173 with the light-emitting element in accordance with the first control signal.

Note that the potential for detecting a defective portion is a potential capable of detecting a defective portion, which does not destroy the light-emitting element. For example, in the light-emitting element which is formed in the substrate 173 with the light-emitting element, a voltage in the reverse-bias direction may be applied to the first electrode and the second electrode so that the voltage gradually increases. When a voltage in the reverse-bias direction which does not destroy a normal light-emitting element is applied to an element including a defect of a short circuit between the first electrode and the second electrode or a potential defect, current flows through the defective portion and near-infrared light is emitted.

Next, the control unit 50 outputs a second control signal to a unit 80 for detecting a defective portion; and the unit 80 for detecting a defective portion detects, in accordance with the second control signal, near-infrared light emitted from the substrate 173 with the light-emitting element, which is supported by the support unit 45, and generates an image signal as well as positional information of the near-infrared light.

The unit 80 for detecting a defective portion illustrated in FIG. 2C as an example includes a driving device 81 and a line sensor 82 provided with a plurality of near-infrared sensors in line including a near-infrared light sensor 82a and a near-infrared light sensor 82b, and generates image data from the near-infrared light emitted from the defective portion and the positional information. Note that the unit 80 for detecting a defective portion is not limited to this structure, and an area sensor in which sensors are disposed in matrix may be employed or a single sensor may be scanned instead of the line sensor.

In addition, a visible light sensor can also be used without limitation to a near-infrared sensor. In the case of using a visible light sensor, for example, a defective portion can be detected from abnormal light emission by application of a voltage in the forward-bias direction which does not destroy the light-emitting element.

<Third Step of Insulation>

Figure 3A:
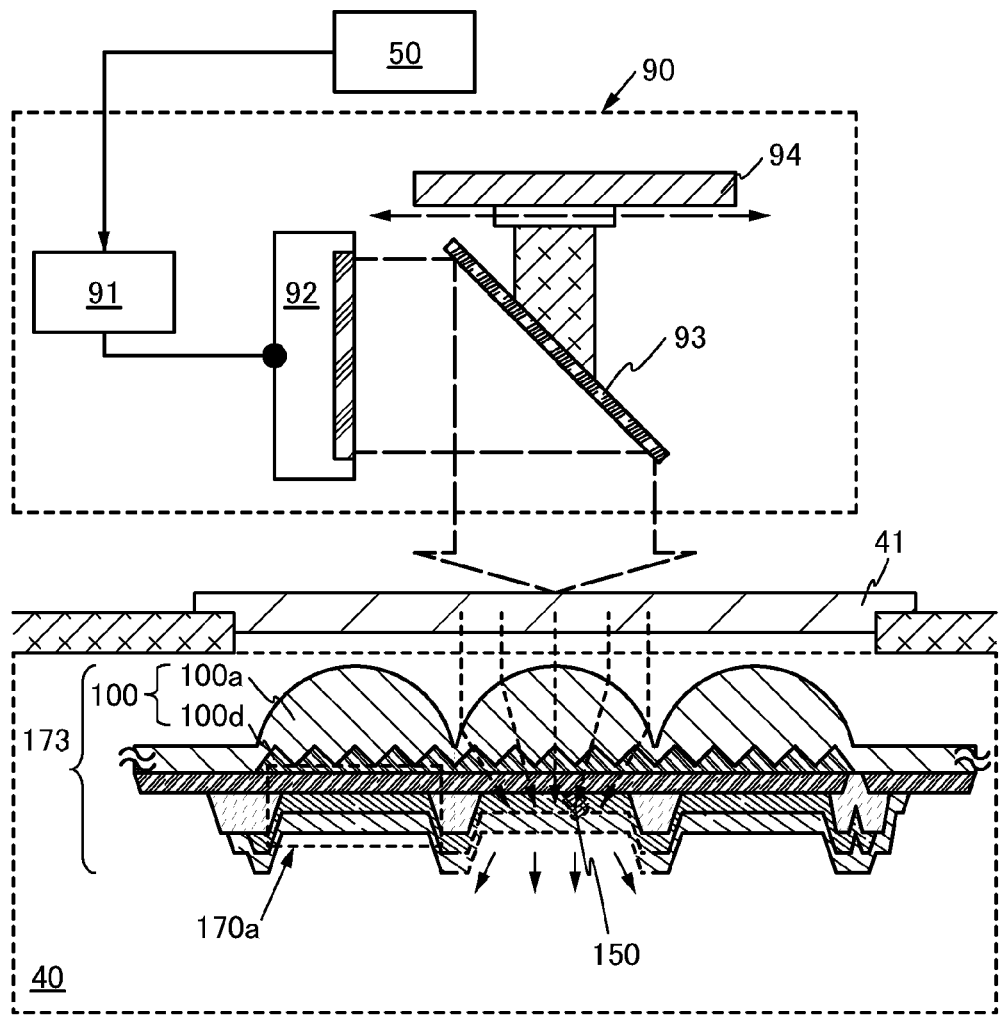
FIGS. 3A and 3B illustrating a method for manufacturing a light-emitting device according to an embodiment.

A method for selectively insulating the defective portion is described with reference to FIG. 3A.

The control unit 50 extracts the positional information of the defective portion from the image generated by the unit 80 for detecting a defective portion. The control unit 50 outputs a third control signal including the positional information of the defective portion to a laser beam irradiation unit 90.

The laser beam irradiation unit 90 includes a control device 91, a laser 92, a mirror 93, and a mirror moving unit 94. The control device 91 controls the laser 92 and the mirror moving unit 94. The mirror moving unit 94 can move the mirror 93 in the arrow directions in FIG. 3A with a linear feed mechanism which is not illustrated.

Next, the control device 91 controls the mirror moving unit 94 in accordance with the positional information of the defective portion included in the third control signal so that the defective portion is irradiated with a laser beam. The control device 91 irradiates the defective portion with a laser beam with the use of the laser 92 after the mirror 93 is moved. Note that in the laser beam irradiation unit 90 illustrated in FIG. 3A, the mirror 93 moves directly above the element including the defective portion due to the conductive particle 150 and the element including the defective portion is irradiated with a laser beam.

The laser beam emitted from the laser beam irradiation unit 90 transmits the window material 41 provided on the wall surface of the treatment chamber 40 and reaches the hemispherical lenses provided in the substrate 173 with the light-emitting element.

Note that the diameter of the hemispherical lens provided for the substrate with the light-emitting element is preferably greater than or equal to 0.2 mm and less than or equal to 20 mm. This is because when the diameter is less than 0.2 mm, there is a little effect of increasing extraction efficiency of light; however, when the diameter is greater than 20 mm, there is an increase in the volume of the hemispherical lens, the cost, or the weight.

The laser beam is condensed by the hemispherical lens, and the light-emitting element overlapping with the hemispherical lens is irradiated with the laser beam whose energy density is increased. In the light-emitting element irradiated with the laser beam whose energy density is increased, the first electrode, the layer containing a light-emitting organic compound, and the second electrode absorb the energy, whereby the temperature increases, the element structure is destroyed, and thus the defective portion is insulated.

In the laser beam emitted from the laser beam irradiation unit 90, the beam diameter which is defined in a half width in the surface of the hemispherical lens, which is a surface to be irradiated, is greater than or equal to 0.1 mm and less than or equal to the diameter of the hemispherical lens, and the energy density is greater than or equal to 1 $kW/cm^2$ and less than or equal to 10 $MW/cm^2$ or greater than or equal to 1 $\mu J/cm^2$ and less than or equal to 10 $mJ/cm^2$. With such a laser beam, the defective portion can be insulated without damaging the spherical lenses of the substrate 173 with the light-emitting element and the window material 41 provided on the wall surface of the treatment chamber 40.

Through the above steps, the substrate 173 with the light-emitting element, which is provided with the element 170d in which the defective portion is insulated and the light-emitting elements 170a and 170c on the same substrate 100, is formed. Note that although FIG. 3A illustrates the case where the layer containing a light-emitting organic compound and the second electrode are all removed from the element including the defective portion; however, only part of them including the defective portion may be removed.

<Fourth Step of Providing Sealing Member>

Figure 3B:
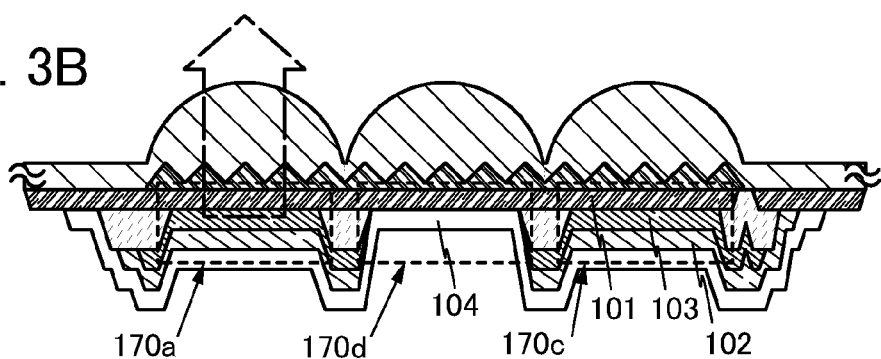

A method for sealing the light-emitting element, in which the defective portion is insulated, between the substrate with the light-emitting element and a sealing member is described with reference to FIG. 3B. The sealing member 104 is formed on the second electrode 102 of the substrate 173 with the light-emitting element, which is provided with the element 170d in which the defective portion is insulated and the light-emitting elements 170a and 170c, to seal the light-emitting elements.

The sealing member 104 can be formed using an inorganic insulating film by a sputtering method, for example. For example, a silicon nitride film, an aluminum oxide film, a silicon oxide film, or the like may be formed.

The sealing member 104 preferably has a gas barrier property of less than or equal to $10^{-6}$ $g/m^2 \cdot day$, for example. A stacked-layer structure in which at least one layer containing an inorganic material is provided between layers containing an organic material can be used for the sealing member 104, for example. As the layer containing an organic material, an adhesive layer such as an epoxy-based adhesive layer can be given as an example. As the layer containing an inorganic material, a film with a barrier property, such as a silicon oxide film or a silicon nitride film, can be given as an example.

The sealing member 104 described in this embodiment as an example is a sealing member in film form. Specifically, a thermosetting resin (e.g., an epoxy-based adhesive) is applied to a film to be a supporting body to a thickness of several tens of micrometers and dried, and an inorganic film (e.g., a silicon oxide film) is formed to a thickness of several micrometers thereover to form a first member; thermosetting epoxy resin is applied to a mold release film and dried to form a second member; and the first member and the second member are bonded to each other, so that a stack is formed. Next, a surface of the stack from which the mold release film is removed is bonded to the second electrode 102 of the above-described light-emitting element so as to face each other, thermocompression is performed, and then the epoxy resin may be cured by heat. With such a structure, the deterioration of the light-emitting element is suppressed and the durability and lifetime of the light-emitting device can be improved.

<Modification Example of First Step of Manufacturing Substrate with Light-Emitting Element>

Although the light-emitting element is formed on the substrate where the hemispherical lenses and the uneven structure are formed in advance in the above method, one embodiment of the present invention is not limited thereto. Here, as a modification example of the method for manufacturing a substrate with a light-emitting element, a method in which a light-emitting element is formed on a flat substrate and a hemispherical lens is provided so as to overlap with the light-emitting element will be described with reference to FIGS. 8A to 8C.

A substrate 300e has a flat surface and needs to transmit at least light emitted from a light-emitting element formed later at a transmittance higher than or equal to 70% and lower than 100%, and can be formed using glass or plastic, for example.

Next, a conductive film for forming a first electrode 301 is formed on one of surfaces of the substrate 300e. A material similar to that of the conductive film for forming the first electrode 101 of the substrate 173 with the light-emitting element described in this embodiment can be applied to this conductive film. Then, the first electrode 301 is formed from the conductive film with a resist mask. In addition, with the conductive film, a first terminal 371 connected to the first electrode and a second terminal 372 connected to the second electrode in the light-emitting element are formed.

Next, a partition wall 340 having openings is formed on the first electrode 301. A material and a method similar to those of the partition wall 140 of the substrate 173 with the light-emitting element described in this embodiment can be applied to the partition wall 340. Note that the opening of the partition wall overlaps with a light extraction region of a light-emitting element formed later, which transmits light emitted from an organic compound (see FIG. 8A).

Figure 8A:
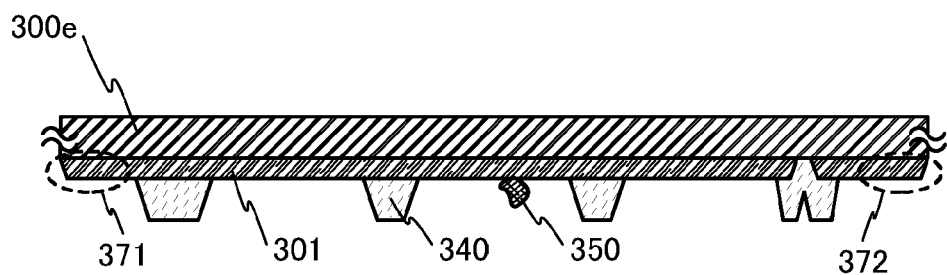
FIGS. 8A to 8C illustrating a manufacturing apparatus of a light-emitting device according to an embodiment.
Figure 8B:
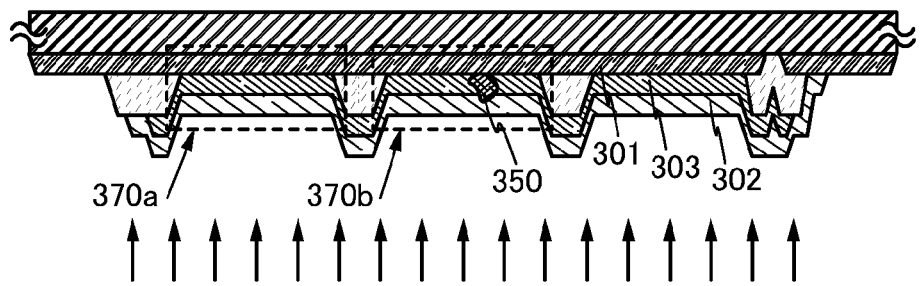
Figure 8C:
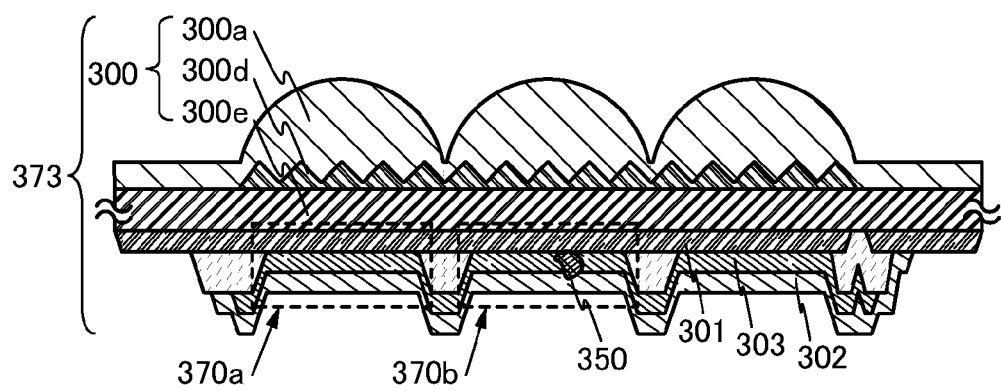

Note that in FIGS. 8A to 8C, a state in which a conductive particle 350 is in contact with the first electrode 301 is schematically illustrated.

Next, the light-emitting element is formed. A layer 303 containing a light-emitting organic compound is formed on the first electrode 301, and then a second electrode 302 is formed using a material and a method similar to those of the light-emitting element described in this embodiment (see FIG. 8B).

Next, to a surface of the substrate 300e opposite to the surface on which the light-emitting element is formed, a structure body including a hemispherical lens 300a, where an uneven structure 300d is formed at the bottom, is attached. A hemispherical lens similar to the hemispherical lens 100a of the substrate 173 with the light-emitting element described in this embodiment can be applied to the hemispherical lens 300a. In addition, an uneven structure similar to the uneven structure 100d of the substrate 173 with the light-emitting element described in this embodiment can be applied to the uneven structure 300d.

Through the above steps, a substrate 373 with a light-emitting element provided with a light-emitting element 370a can be formed. Note that since there is the conductive particle 350 between the first electrode 301 and the second electrode 302, the substrate 373 with the light-emitting element includes an element 370b including a defective portion (see FIG. 8C).

In this embodiment, in a method for manufacturing a light-emitting device which is described in this embodiment as an example, a substrate with a light-emitting element, including a light-emitting element and a hemispherical lens overlapping with a light extraction region of the light-emitting element, is disposed in a treatment chamber where the pressure is reduced; a defective portion of the light-emitting element is detected; and the defective portion is insulated by irradiation with a laser beam through the hemispherical lens and a window material provided on a wall surface of the treatment chamber, which transmits a laser beam. According to this method, a light-emitting device can be manufactured by insulation of a defective portion of a light-emitting element provided in a substrate with a light-emitting element before a sealing member is provided. In addition, the above manufacturing method is a method in which the hemispherical lens disposed close to the defective portion is used to condense laser beams. According to this method, an optical system having a high magnification and a narrow depth of focus are not needed to be disposed, whereby the structure of a manufacturing apparatus can be simplified. Moreover, the above manufacturing method is a method in which the hemispherical lens is disposed between the defective portion and a laser irradiation unit so that the defective portion is irradiated with a laser beam. According to this method, an evaporated material from a surface to be irradiated does not contaminate the laser irradiation unit and thus the frequency of maintenance can be reduced. Further, since the hemispherical lens is provided, light emission can be extracted at high efficiency.

This embodiment can be combined with any of the other embodiments in this specification as appropriate.

[Embodiment 2]

In this embodiment, with reference to FIG. 4, a method for manufacturing a light-emitting device will be described in which a defective portion generated in the light-emitting device including a light-emitting element and a hemispherical lens overlapping with a light extraction region of the light-emitting element is detected; the defective portion is insulated by irradiation with a laser beam through the hemispherical lens; and then a sealing member is provided.

Figure 4:
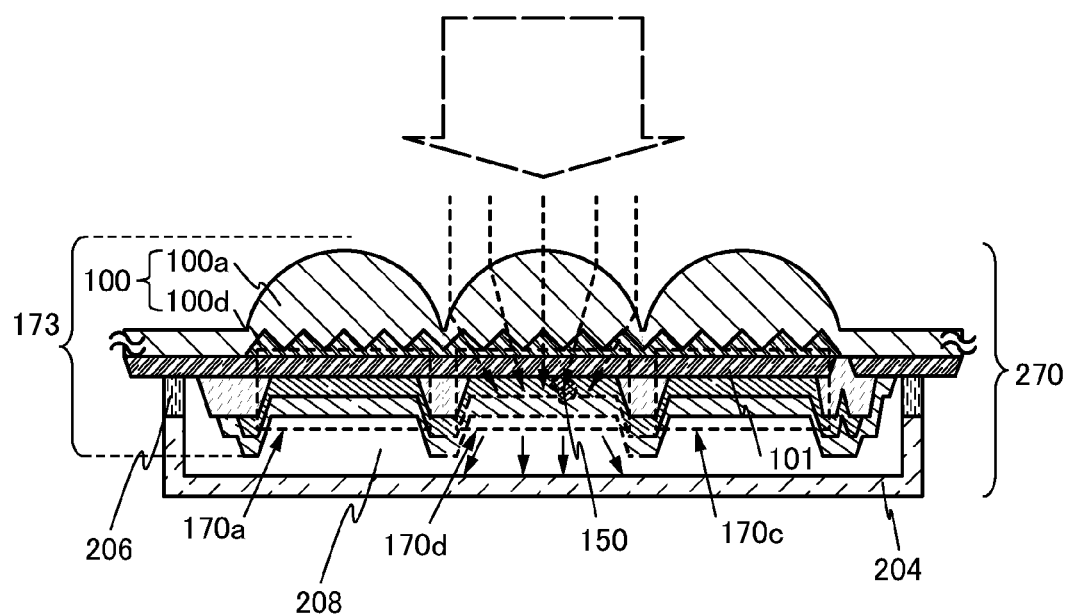
FIG. 4 illustrating a method for manufacturing a light-emitting device according to an embodiment.

FIG. 4 illustrates a cross-sectional example of a structure of a light-emitting device manufactured with a method described as an example in this embodiment. A light-emitting device 270 includes the substrate 173 with the light-emitting element provided with the light-emitting elements 170a and 170c and the insulated element 170d which are in contact with the substrate 100, and a plate-like sealing member 204 which separates, from the air, a space 208 sealing a plurality of light-emitting elements including the light-emitting elements 170a and 170c. That is, the light-emitting device 270 has the same structure as the light-emitting device 170 described in Embodiment 1 except that the plate-like sealing member 204 which separates the space 208 from the air is used.

Next, an example of a method for manufacturing the light-emitting device 270 will be described.

<First Step of Forming Substrate with Light-Emitting Element>

The substrate 173 with the light-emitting element is formed using the method described in Embodiment 1. Note that since there is a conductive particle between the first electrode 101 and the second electrode, the substrate 173 with the light-emitting element includes an element including a defective portion.

<Second Step of Providing Sealing Member>

Next, the sealing member 204 is attached to the substrate 173 with the light-emitting element to form the space 208 sealing the plurality of light-emitting elements including the light-emitting elements 170a and 170c.

As the sealing member 204, a sealing member having a gas barrier property with respect to an impurity (e.g., moisture) which deteriorates reliability of the light-emitting element is used. Specifically, glass, metal, plastic which is covered or stacked with an inorganic film having a gas barrier property, a composite material of a combination of any of these materials, or the like can be used. In this embodiment, a glass substrate in which a depression is formed is used as the sealing member 204, and the sealing member 204 is attached to the substrate 173 with the light-emitting element with the use of a sealant 206 which is applied so as to surround the depression, whereby the space 208 sealing the plurality of light-emitting elements is formed.

Through the above steps, the light-emitting device can be formed. Note that since there is a conductive particle between the first electrode and the second electrode, the light-emitting device includes a defective portion.

<Third Step of Detecting Defective Portion>

The defective portion of the light-emitting device is detected using a unit for detecting a defective portion. The defective portion of the light-emitting device may be detected by applying the method described in Embodiment 1. Note that in this embodiment, an environment of the treatment chamber does not need to be an environment where the pressure is reduced less than the atmospheric pressure or an environment filled with a dry inert gas. This is because the light-emitting element of the light-emitting device is protected by the sealing member 204.

<Fourth Step of Insulation>

A method for selectively insulating the defective portion is described. The defective portion may be insulated by applying the method described in Embodiment 1. Note that in this embodiment, an environment of the treatment chamber does not need to be an environment where the pressure is reduced less than the atmospheric pressure or an environment filled with a dry inert gas. This is because the light-emitting element of the light-emitting device is protected by the sealing member 204.

Note that the diameter of the hemispherical lens provided for the substrate with the light-emitting element is preferably greater than or equal to 0.2 mm and less than or equal to 20 mm.

The light-emitting element irradiated with a laser beam whose energy density is increased by the hemispherical lens is insulated.

In the laser beam emitted from the laser beam irradiation unit, the beam diameter which is defined in a half width in the surface of the hemispherical lens, which is a surface to be irradiated, is greater than or equal to 0.1 mm and less than or equal to the diameter of the hemispherical lens, and the energy density is greater than or equal to 1 kW/cm$^2$ and less than or equal to 10 MW/cm$^2$ or greater than or equal to 1 µJ/cm$^2$ and less than or equal to 10 mJ/cm$^2$. With such a laser beam, the defective portion can be insulated without damaging the spherical lenses of the substrate 173 with the light-emitting element.

Through the above steps, the light-emitting device 270, which is provided with the element 170d in which the defective portion is insulated and the light-emitting elements 170a and 170c on the same substrate 100, is formed.

Note that although the manufacturing method of the light-emitting device is described in this embodiment in which light emission of the light-emitting element is extracted through the first electrode, the substrate, and the hemispherical lens, one embodiment of the present invention is not limited thereto. For example, a light-emitting device in which light emission is extracted through a second electrode overlapping with a first electrode which is provided in contact with a substrate may also be employed. For example, one embodiment of the present invention can also be employed to a light-emitting device provided with a so-called top emission light-emitting element, that is, a light-emitting element having such a structure. Specifically, one embodiment of the present invention also includes a method for manufacturing a light-emitting device, including a first step of forming the light-emitting element by providing a region of the second electrode, which transmits light emission of the light-emitting element; a second step of forming a sealing member covering the light-emitting element on the second electrode side; a third step of forming a hemispherical lens on the second electrode side so as to overlap with the region which transmits the light emission; a fourth step of detecting a defective portion; and a fifth step of insulating the defective portion by irradiation with a laser beam.

The above embodiment of the present invention is a method in which a defective portion of a light-emitting device including a light-emitting element and a hemispherical lens overlapping with a light extraction region of the light-emitting element is insulated by irradiation with a laser beam through the hemispherical lens. According to this method, a light-emitting device can be manufactured by insulation of a defective portion of a light-emitting element included in the light-emitting device. In addition, the above embodiment of the present invention is a method in which the hemispherical lens disposed close to the defective portion is used to condense laser beams. According to this method, an optical system having a high magnification and a narrow depth of focus are not needed to be disposed, whereby the structure of a manufacturing apparatus can be simplified. Moreover, the above embodiment of the present invention is a method in which the hemispherical lens is disposed between the defective portion and a laser irradiation unit so that the defective portion is irradiated with a laser beam. According to this method, an evaporated material from a surface to be irradiated does not contaminate the laser irradiation unit and thus the frequency of maintenance can be reduced.

This embodiment can be combined with any of the other embodiments in this specification as appropriate.

[Embodiment 3]

In this embodiment, with reference to FIG. 5 and FIG. 6, a manufacturing apparatus of a light-emitting device will be described in which a substrate with a light-emitting element, including a light-emitting element and a hemispherical lens overlapping with a light extraction region of the light-emitting element, is disposed in a treatment chamber where the pressure is reduced; a defective portion of the light-emitting element is detected; the defective portion is insulated by irradiation with a laser beam through the hemispherical lens and a window material provided on a wall surface of the treatment chamber; and then a sealing member is provided.

Figure 5:
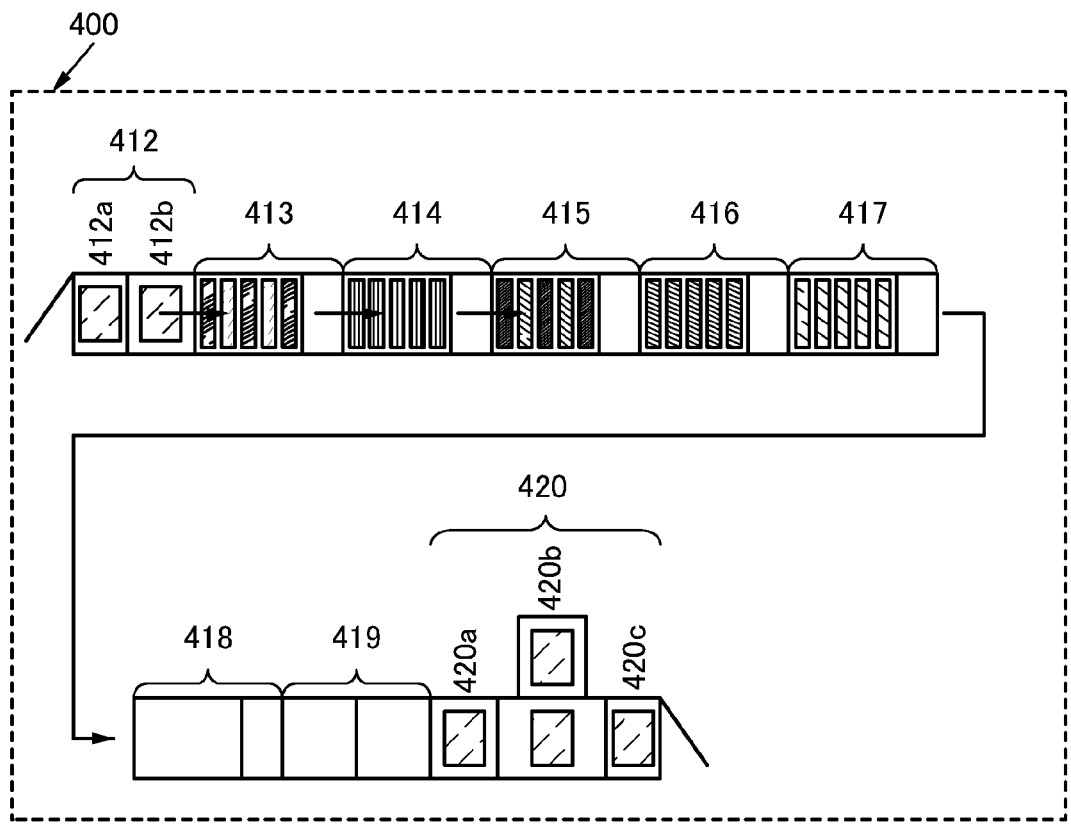
FIG. 5 illustrating a manufacturing apparatus of a light-emitting device according to an embodiment.

FIG. 5 illustrates a manufacturing apparatus of a light-emitting device described as an example in this embodiment. A manufacturing apparatus 400 of a light-emitting device includes a pretreatment portion 412, a first evaporation chamber 413, a second evaporation chamber 414, a third evaporation chamber 415, a fourth evaporation chamber 416, a fifth evaporation chamber 417, a sixth evaporation chamber 418, a treatment chamber 419 for a defective portion, and a post-treatment portion 420. Note that the first evaporation chamber 413, the second evaporation chamber 414, the third evaporation chamber 415, the fourth evaporation chamber 416, and the fifth evaporation chamber 417 are each provided with linear evaporation sources having a major axis intersected with a direction in which a substrate moves.

The pretreatment portion 412 includes a load portion 412a and a pretreatment chamber 412b. The load portion 412a is a chamber where a plurality of substrates which is carried by the atmospheric pressure is stocked and the pressure is reduced up to a pressure at which evaporation can be performed by an evacuation unit which is not illustrated in FIG. 5. Impurities attached to the substrate can be removed by the pretreatment in the pretreatment chamber 412b. As examples of the pretreatment, vacuum heat treatment and UV irradiation treatment can be given.

The post-treatment portion 420 includes a delivery chamber 420a, a sealing chamber 420b, and an unload portion 420c. The delivery chamber 420a is a chamber for transferring the substrate with the light-emitting element which is placed in an environment where the pressure is reduced to an environment under the atmospheric pressure, which includes an evacuation unit and a unit for filling the delivery chamber 420a with a high-purity inert gas, which are not illustrated in FIG. 5. The sealing chamber 420b is a chamber for providing a sealing member to the substrate with light-emitting element, and the sealing member protects the light-emitting element and the insulated light-emitting element from the air.

From the first evaporation chamber 413 to the fifth evaporation chamber 417 are each provided with linear evaporation sources. In addition, the sixth evaporation chamber 418 may be provided with a linear evaporation source, a point-source-type evaporation source, or a sputtering deposition apparatus.

The linear evaporation source is an evaporation source which heats and vaporizes an evaporation material, and the evaporation material diffuses in one direction. The longitudinal direction of the evaporation source described in this embodiment as an example is orthogonal to the direction in which the substrate is transferred, which is longer than or equal to the width of the substrate (the length of the side of the substrate, which is orthogonal to the direction in which the substrate is transferred). When the substrate is transferred in one direction while being exposed to the evaporation source having such a structure, an evaporated film can be formed on the entire surface of the substrate.

Note that each evaporation chamber is provided with a buffer portion and is connected to the adjacent evaporation chamber through the buffer portion. By providing the buffer portion, a phenomenon in which an evaporated material blown off from the adjacent evaporation chamber is mixed into the film during evaporation can be prevented. Note that each evaporation chamber includes a unit for transferring the substrate and an evacuation unit which are not illustrated in FIG. 5.

Figure 6:
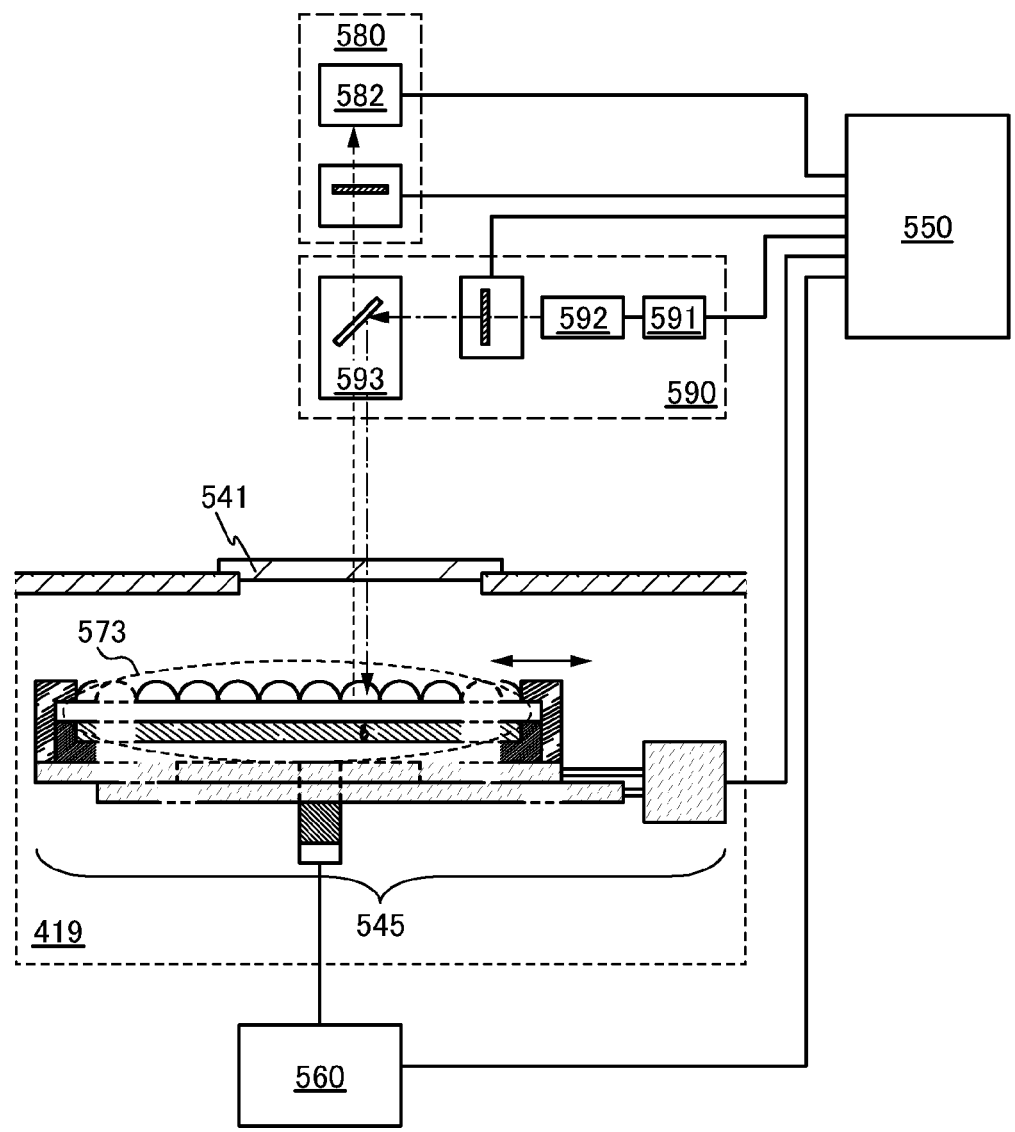
FIG. 6 illustrating a manufacturing apparatus of a light-emitting device according to an embodiment.

A detail of a structure of the treatment chamber 419 for a defective portion is described with reference to a side view (FIG. 6). The treatment chamber 419 for a defective portion is part of the manufacturing apparatus 400 of a light-emitting device. In the treatment chamber 419 for a defective portion, a window portion including a window material 541 is provided on a wall surface, and a support unit 545 is provided inside. In addition, outside the defective portion treatment chamber 419, a power supply 560, a unit 580 for detecting a defective portion, a laser beam irradiation unit 590, and a control unit 550 are provided.

The support unit 545 supports a substrate 573 with a light-emitting element, whose surface spreads not only in a horizontal direction of paper but also in a perpendicular direction thereof, and moves the substrate 573 with the light-emitting element at least in a horizontal direction and a perpendicular direction of paper.

The power supply 560 outputs a potential for detecting a defective portion to the substrate 573 with the light-emitting element. The unit 580 for detecting a defective portion includes a near-infrared sensor 582, which detects a defective portion of the substrate 573 with the light-emitting element. The laser beam irradiation unit 590 includes a control device 591, a laser 592, and a half mirror 593, and the defective portion of the substrate 573 with the light-emitting element, which is detected by the unit 580 for detecting a defective portion, is irradiated with a laser beam and insulated. The control unit 550 outputs control signals to the support unit 545, the power supply 560, the unit 580 for detecting a defective portion, and the laser beam irradiation unit 590.

The unit 580 for detecting a defective portion described in this embodiment as an example is fixed, and the substrate 573 with the light-emitting element is moved using the support unit 545. In addition, optical axes of the unit 580 for detecting a defective portion and the laser beam irradiation unit 590 can be aligned to each other through the half mirror 593, so that the defective portion can be detected and insulated successively.

In the laser 592 used in this embodiment, laser light whose wavelength is not absorbed by a support or a sealing film of the light-emitting element or a sealing substrate is selected and used. For example, as the laser beam, it is possible to use a laser beam emitted from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic or a third harmonic oscillated from the above-described solid-state laser, and further a higher harmonics can be used. Note that when a solid-state laser whose laser medium is solid is used, there are advantages in that a maintenance-free condition can be maintained for a long time and output of the laser beam is relatively stable. A short time pulsed laser such as nanosecond, picosecond, and femtosecond is appropriate for this process. With the short time pulsed laser, a high-density energy which causes a multiphoton absorption phenomenon can be applied to an abnormal light-emission portion of the light-emitting element.

In the laser beam described in this embodiment as an example, the beam diameter which is defined in a half width in the surface of the hemispherical lens, which is a surface to be irradiated, is greater than or equal to 0.1 mm and less than or equal to the diameter of the hemispherical lens, and the energy density is greater than or equal to 1 $kW/cm^2$ and less than or equal to 10 $MW/cm^2$ or greater than or equal to 1 $\mu J/cm^2$ and less than or equal to 10 $mJ/cm^2$. With such a laser beam, the defective portion can be insulated without damaging the hemispherical lenses of the substrate 573 with the light-emitting element and the window material 541 provided on the wall surface of a treatment chamber 540.

Figure 7A:
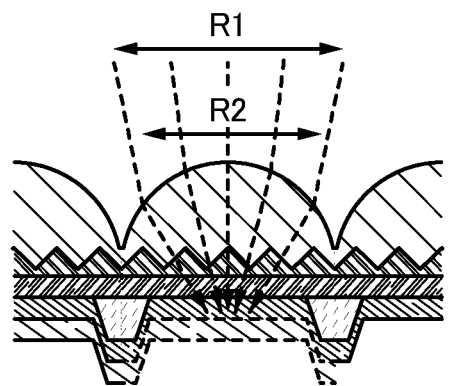
FIGS. 7A and 7B illustrating a method for manufacturing a light-emitting device according to an embodiment.
Figure 7B:
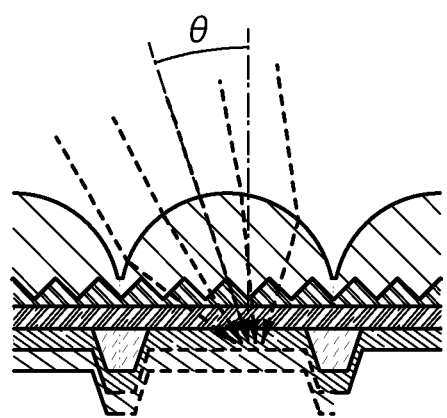

Note that the laser beam emitted from the laser beam irradiation unit 590 is not limited to a parallel beam. For example, as illustrated in FIG. 7A, condensed light in which a half width becomes gradually smaller (R1>R2) in the traveling direction of laser beams may be used. Alternatively, as illustrated in FIG. 7B, a structure in which irradiation is performed with an inclination of A with respect to the substrate with the light-emitting element, which is provided with the hemispherical lens, may be employed. An insulated position of the light-emitting element can be adjusted by performing irradiation with a laser beam with inclination.

The above embodiment of the present invention includes an evacuation unit, and, inside a treatment chamber separated from the air, a unit for supporting a substrate with a light-emitting element in which a hemispherical lens overlapping with a light extraction region of the light-emitting element is provided to face a window material provided on a wall surface of the treatment chamber. In addition, outside the treatment chamber, the following are included: a power supply which outputs a potential for detecting a defective portion (e.g., a reverse bias potential) to the light-emitting element; a unit for detecting a defective portion which can detect near-infrared light caused by current flowing through the defective portion and which includes a near-infrared sensor capable of generating an image including positional information of the defective portion; a laser irradiation unit which emits a laser beam with which the defective portion can be irradiated; and a control unit. According to this structure, a light-emitting device can be manufactured by insulation of the defective portion of the light-emitting element provided in the substrate with the light-emitting element before a sealing member is provided. Moreover, an evaporated material from a surface to be irradiated does not contaminate the laser irradiation unit and thus the frequency of maintenance can be reduced. Further, a unit for forming a sealing member is included in addition to the above structure. According to this structure, after the defective portion is insulated, a sealing member covering the insulated portion can be formed. Since the sealing member can be formed directly on the insulated portion, a phenomenon in which an impurity is diffused into the light-emitting element from the insulated portion can be prevented.

This embodiment can be combined with any of the other embodiments in this specification as appropriate.

[Embodiment 4]

In this embodiment, with reference to FIGS. 9A to 9C and FIGS. 10A and 10B, an example of a structure of a light-emitting element to which the manufacturing method of a light-emitting device can be applied, in which a substrate with a light-emitting element, including a light-emitting element and a hemispherical lens overlapping with a light extraction region of the light-emitting element, is disposed in a treatment chamber; a defective portion of the light-emitting element is detected; and the defective portion is insulated by irradiation with a laser beam through the hemispherical lens and a window material provided on a wall surface of the treatment chamber, will be described.

The light-emitting element described in this embodiment as an example includes a first electrode, a second electrode, and a layer containing a light-emitting organic compound (hereinafter referred to as an EL layer) provided between the first electrode and the second electrode. In this embodiment, the first electrode and the second electrode formed on a substrate function as an anode and a cathode, respectively. The EL layer is provided between the first electrode and the second electrode, and the structure of the EL layer may be selected as appropriate in accordance with a material of the first electrode and second electrode. An example of the structure of the light-emitting element will be described below; it is needless to say that the structure of the light-emitting element is not limited to this example.

<Structure Example 1 of Light-Emitting Element>

Figure 9A:
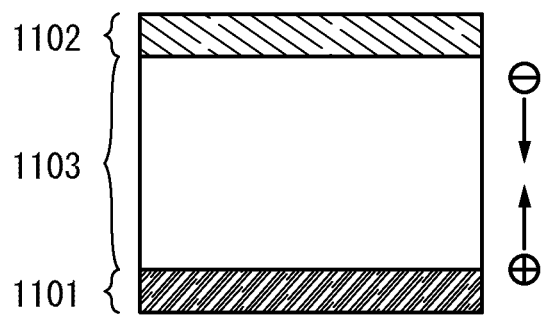
FIGS. 9A to 9C illustrating a structure of a light-emitting element according to an embodiment.

An example of the structure of the light-emitting element is illustrated in FIG. 9A. In the light-emitting element illustrated in FIG. 9A, an EL layer 1103 is provided between an anode 1101 and a cathode 1102.

When voltage higher than the threshold voltage of the light-emitting element is applied between the anode 1101 and the cathode 1102, holes are injected to the EL layer 1103 from the anode 1101 side and electrons are injected to the EL layer 1103 from the cathode 1102 side. The injected electrons and holes are recombined in the EL layer 1103 and the light-emitting substance contained in the EL layer 1103 emits light.

The EL layer 1103 needs to include at least a light-emitting layer containing a light-emitting substance, and may have a structure in which a layer other than the light-emitting layer and the light-emitting layer are stacked. For example, as the layer other than the light-emitting layer, layers containing a substance having a high hole-injection property, a substance having a high hole-transport property, a substance having a low hole-transport (blocking) property, a substance having a high electron-transport property, a substance having a high electron-injection property, and a substance having a bipolar property (a substance having high electron-and-hole-transport properties) can be given.

Figure 9B:
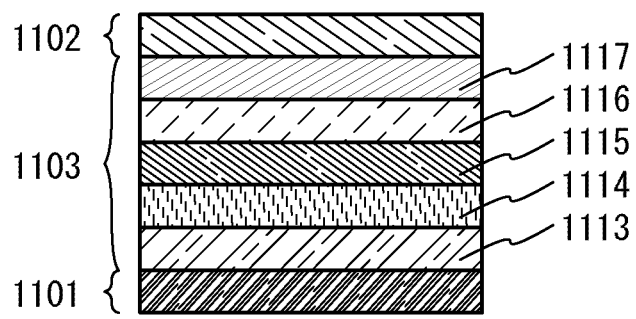

An example of a specific structure of the EL layer 1103 is illustrated in FIG. 9B. The EL layer 1103 illustrated in FIG. 9B has a structure in which a hole-injection layer 1113, a hole-transport layer 1114, a light-emitting layer 1115, an electron-transport layer 1116, and an electron-injection layer 1117 are stacked in this order from the anode 1101 side.

<Structure Example 2 of Light-Emitting Element>

Figure 9C:
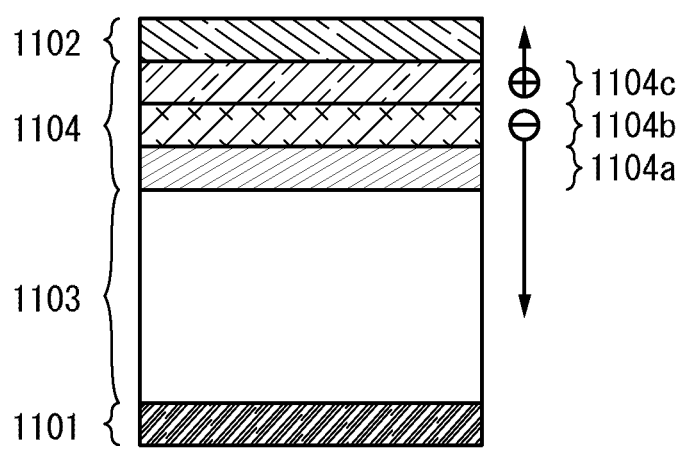

Another example of the structure of the light-emitting element is illustrated in FIG. 9C. In the light-emitting element illustrated as an example in FIG. 9C, the EL layer 1103 is provided between the anode 1101 and the cathode 1102. Further, an intermediate layer 1104 is provided between the cathode 1102 and the EL layer 1103. Note that a structure similar to that in the above structure example 1 of the light-emitting element can be applied to the EL layer 1103 in the structure example 2 of the light-emitting element, and for the details, the description of the structure example 1 of the light-emitting element can be referred to.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in this order from the cathode 1102 side.

The behaviors of electrons and holes in the intermediate layer 1104 are described. When voltage higher than the threshold voltage of the light-emitting element is applied between the anode 1101 and the cathode 1102, in the first charge generation region 1104c, holes and electrons are generated, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier in injection of electrons into the EL layer 1103, and the efficiency of the electron injection into the EL layer 1103 can be improved. Thus, the electrons generated in the first charge generation region 1104c are injected into the LUMO level of the EL layer 1103 through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface thereof and the functions of the first charge generation region 1104c and the electron-injection buffer 1104a are damaged.

<Structure Example 3 of Light-Emitting Element>

Figure 10A:
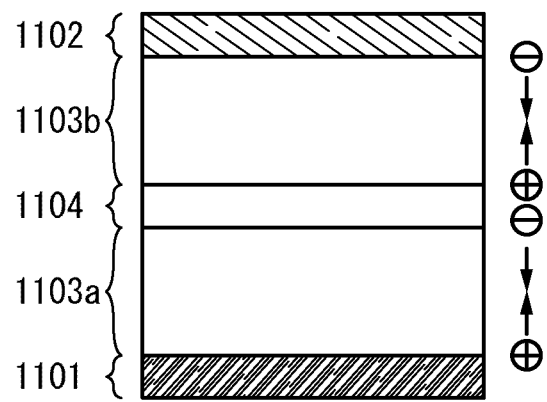
FIGS. 10A and 10B illustrating a structure of a light-emitting element according to an embodiment.
Figure 10B:
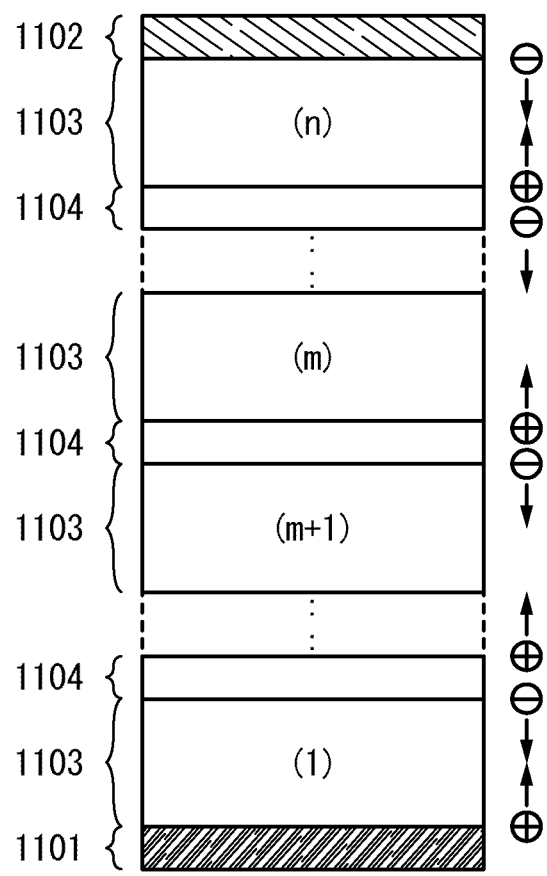

Another example of the structure of the light-emitting element is illustrated in FIG. 10A. In the light-emitting element illustrated as an example in FIG. 10A, two EL layers are provided between the anode 1101 and the cathode 1102. Further, the intermediate layer 1104 is provided between an EL layer 1103a and an EL layer 1103b.

Note that the number of the EL layer which is provided between the anode and the cathode is not limited to two. The structure of the light-emitting element illustrated in FIG. 10B as an example is a so-called a stacked-layer element structure, that is, a structure in which a plurality of EL layers 1103 is stacked. Note that in the case of a structure in which n (n is a natural number of 2 or more) EL layers 1103 are stacked between the anode and the cathode, the intermediate layer 1104 is provided between an m-th (m is a natural number greater than or equal to 1 and less than or equal to n−1) EL layer and an (m+1)-th EL layer.

Note that a structure similar to that in the above structure example 1 of the light-emitting element can be applied to the EL layers 1103a and 1103b in the structure example 3 of the light-emitting element; a structure similar to that in the above structure example 2 of the light-emitting element can be applied to the intermediate layer 1104 in the structure example 3 of the light-emitting element. Thus, for the details, the description of the structure example 1 of the light-emitting element or the structure example 2 of the light-emitting element can be referred to.

The behaviors of electrons and holes in the intermediate layer 1104 provided between the EL layers are described. When voltage higher than the threshold voltage of the light-emitting element is applied between the anode 1101 and the cathode 1102, in the intermediate layer 1104, holes and electrons are generated, and the holes move into the EL layer which is provided on the cathode 1102 side and the electrons move into the EL layer which is provided on the anode 1101 side. The holes injected into the EL layer which is provided on the cathode side are recombined with the electrons injected from the cathode side, so that the light-emitting substance contained in the EL layer emits light. The electrons injected into the EL layer which is provided on the anode side are recombined with the holes injected from the anode side, so that the light-emitting substance contained in the EL layer emits light. Thus, the holes and electrons generated in the intermediate layer 1104 cause light emission in the respective EL layers.

Note that the EL layers can be provided in contact with each other when these EL layers allow the same structure as the intermediate layer to be formed therebetween. The EL layers can be formed in contact with each other specifically when one of the contacting surfaces of the EL layers is provided with a charge generation region, because the charge generation region functions as a first charge generation region of an intermediate layer.

The structure examples 1 to 3 of the light-emitting element can be implemented in combination. For example, an intermediate layer may be provided between the cathode and the EL layer in the structure example 3 of the light-emitting element.

[Embodiment 5]

In this embodiment, examples of a lighting device including a light-emitting device according to one embodiment of the present invention will be described with reference to FIGS. 11A and 11B.

In this embodiment, a lighting device whose light-emitting portion has a curved surface can also be provided.

One embodiment of the present invention can also be applied to lighting in a car; for example, lighting can be easily provided for a dashboard, ceiling, or the like.

Figure 11A:
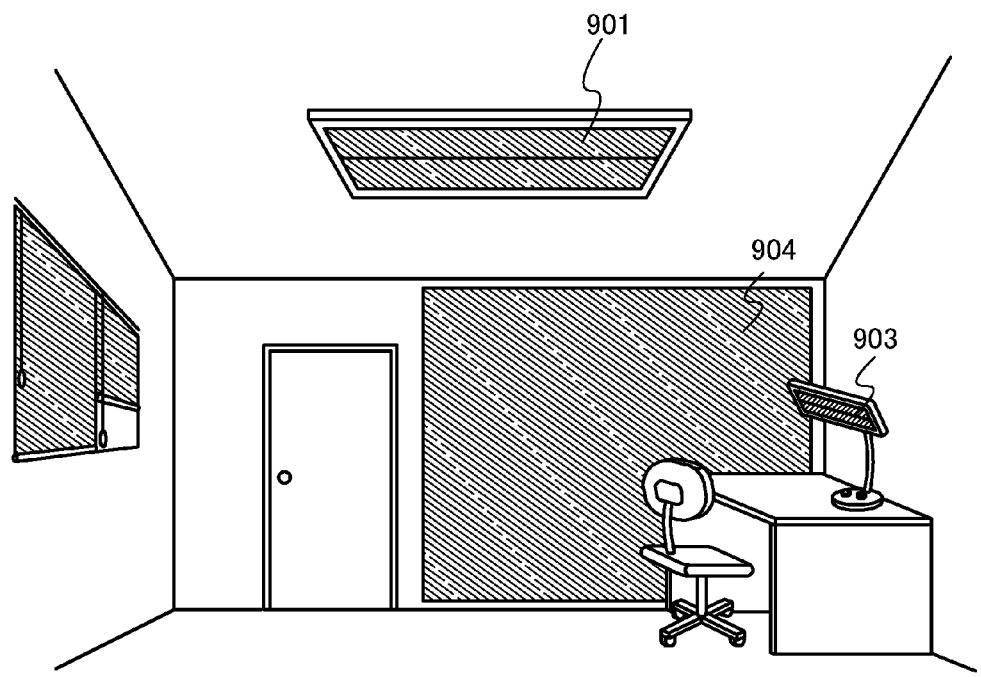
FIGS. 11A and 11B illustrating a lighting device including a light-emitting device according to an embodiment.

FIG. 11A illustrates an interior lighting device 901 provided on a ceiling, a lighting device 904 provided on a wall surface, and a desk lamp 903 to which one embodiment of the present invention is applied. Since the area of the light-emitting device can be increased, the light-emitting device can be used as a lighting device with a large area.

Figure 11B:
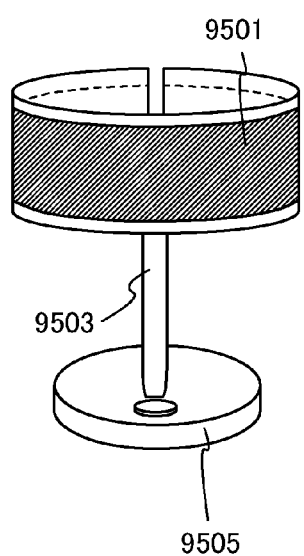

FIG. 11B illustrates an example of another lighting device. A desk lamp illustrated in FIG. 11B includes a lighting portion 9501, a support 9503, a support base 9505, and the like. The lighting portion 9501 includes a light-emitting device according to one embodiment of the present invention. In this embodiment, a lighting device whose light-emitting portion has a curved surface can be thus provided.

This embodiment can be freely combined with any of the other embodiments.

This application is based on Japanese Patent Application Serial No. 2011-017966 filed with Japan Patent Office on Jan. 31, 2011, the entire contents of which are hereby incorporated by reference.

What is claimed is:

1. A method for manufacturing a light-emitting device comprising:
   providing a substrate, wherein a hemispherical lens is provided over a first surface of the substrate;
   forming a light-emitting element over a second surface of the substrate, wherein the light-emitting element includes a light-emitting organic compound between a pair of electrodes;
   forming a sealing member covering the light-emitting element;
   detecting a defective portion of the light-emitting element; and
   insulating the defective portion by irradiation with a laser beam through the hemispherical lens in the case where the defective portion is detected,
   wherein an energy density of the laser beam is greater than or equal to 1 kW/cm$^2$ and less than or equal to 10 MW/cm$^2$ or greater than or equal to 1 μJ/cm$^2$ and less than or equal to 10 mJ/cm$^2$,
   wherein a diameter of the hemispherical lens is greater than or equal to 0.2 mm and less than or equal to 20 mm, and
   wherein a beam diameter of the laser beam is greater than or equal to 0.1 mm and less than or equal to the diameter of the hemispherical lens.

2. The method for manufacturing a light-emitting device according to claim 1,
   wherein the step of detecting the defective portion is performed through the hemispherical lens while a reverse bias voltage as the inspection power is supplied to the light-emitting element.

3. A method for manufacturing a light-emitting device comprising:
   providing a substrate, wherein a hemispherical lens is provided over a first surface of the substrate;
   forming a light-emitting element over a second surface of the substrate, wherein the light-emitting element includes a light-emitting organic compound between a pair of electrodes;
   detecting a defective portion of the light-emitting element;
   insulating the defective portion by irradiation with a laser beam through the hemispherical lens in a treatment chamber where pressure is reduced in the case where the defective portion is detected; and
   forming a sealing member covering the light-emitting element in which the defective portion is insulated,
   wherein an energy density of the laser beam is greater than or equal to 1 kW/cm$^2$ and less than or equal to 10 MW/cm$^2$ or greater than or equal to 1 μJ/cm$^2$ and less than or equal to 10 mJ/cm$^2$,
   wherein a diameter of the hemispherical lens is greater than or equal to 0.2 mm and less than or equal to 20 mm, and
   wherein a beam diameter of the laser beam is greater than or equal to 0.1 mm and less than or equal to the diameter of the hemispherical lens.

4. The method for manufacturing a light-emitting device according to claim 3,
   wherein the step of detecting the defective portion is performed through the hemispherical lens while a reverse bias voltage as the inspection power is supplied to the light-emitting element.

5. The method for manufacturing a light-emitting device according to claim 1,
   wherein the substrate includes an uneven structure between the hemispherical lens and the light-emitting element.

6. The method for manufacturing a light-emitting device according to claim 3,
   wherein the substrate includes an uneven structure between the hemispherical lens and the light-emitting element.

7. The method for manufacturing a light-emitting device according to claim 1,
   wherein near-infrared sensors arranged in line are used for detecting the defective portion of the light-emitting element.

8. The method for manufacturing a light-emitting device according to claim 3,
   wherein near-infrared sensors arranged in line are used for detecting the defective portion of the light-emitting element.

* * * * *